(12) United States Patent
Yangyang et al.

(10) Patent No.: US 12,543,570 B2
(45) Date of Patent: Feb. 3, 2026

(54) COOLING PACKAGE STRUCTURE APPLIED TO INTEGRATED CIRCUIT

(71) Applicant: NVIDIA Corporation, Santa Clara, CA (US)

(72) Inventors: Xiao Yangyang, Santa Clara, CA (US); Jiang Zhi, Santa Clara, CA (US); Li Yuan, Santa Clara, CA (US); Zhou Jie, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 407 days.

(21) Appl. No.: 18/150,598

(22) Filed: Jan. 5, 2023

(65) Prior Publication Data
US 2023/0317555 A1   Oct. 5, 2023

(51) Int. Cl.
*H01L 23/42* (2006.01)
*H01L 23/00* (2006.01)

(52) U.S. Cl.
CPC ............. *H01L 23/42* (2013.01); *H01L 24/13* (2013.01); *H01L 2224/32225* (2013.01); *H01L 2924/15311* (2013.01)

(58) Field of Classification Search
CPC ...................... H01L 23/42; H01L 24/13; H01L 2224/32225; H01L 2924/15311
See application file for complete search history.

(56) References Cited

U.S. PATENT DOCUMENTS

| 7,932,597 B2 * | 4/2011 | Terui | H01L 23/4334 257/E23.101 |
| 2015/0084182 A1 * | 3/2015 | De Cecco | H01L 23/4093 438/122 |
| 2020/0185289 A1 * | 6/2020 | Modi | H01L 21/4857 |

\* cited by examiner

*Primary Examiner* — Timor Karimy

(57) ABSTRACT

A cooling package for an integrated circuit, including: package substrate of the integrated circuit having a first package surface, an enclosure and a thermal conductive material filling a gap between the substrate and a circuit die locatable therein and filling a gap between interior sidewalls of the enclosure and sidewall surfaces of the circuit die couplable to the first package surface. A method including: mounting an enclosure to the first package surface, the enclosure surrounding a location on the first package surface the circuit die is couplable thereto and the circuit die is locatable therein, and, filling the enclosure with the thermal conductive material such that the gaps are filled with the thermal conductive material. An integrated circuit cooling package including the substrate, first and second enclosures and first and second thermal conductive materials is also disclosed.

15 Claims, 4 Drawing Sheets

COOLING PACKAGE STRUCTURE APPLIED TO INTEGRATED CIRCUIT

CROSS-REFERENCE TO RELATED APPLICATION

Figure 1:
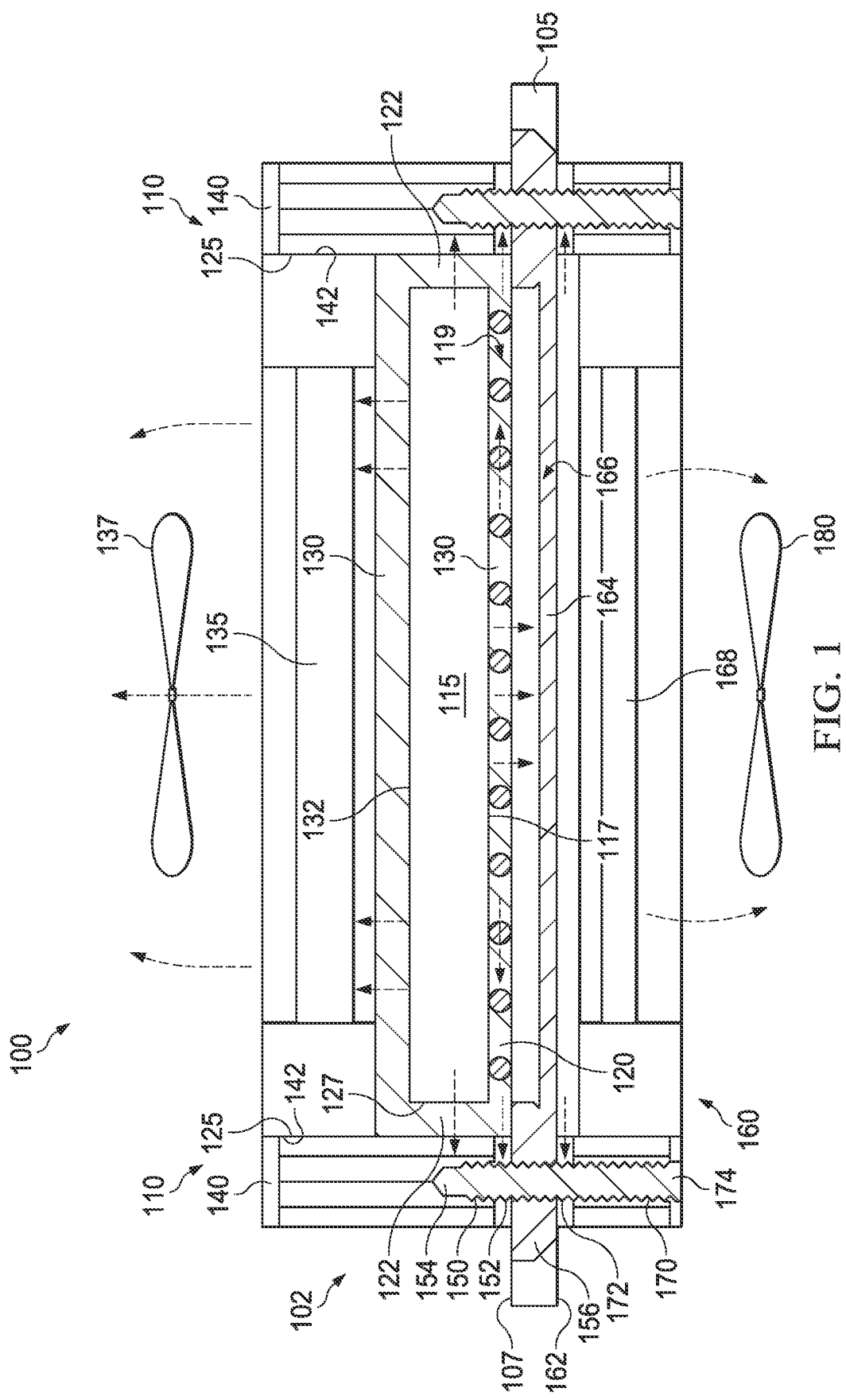

This application claims priority to CN Patent Application No. 202210322183.3, entitled "A COOLING PACKAGE STRUCTURE APPLIED TO INTEGRATED CIRCUIT AND METHOD OF ASSEMBLY THEREOF", filed Mar. 29, 2022. The above-listed application is commonly assigned with the present application is incorporated herein by reference as if reproduced herein in its entirety.

TECHNICAL FIELD

This application is directed, in general, to cooling packages for integrated circuits and methods of manufacturing thereof, and in particular, cooling packages that includes circuit die enclosures.

BACKGROUND

Coolers are often installed on the top of circuit dies (also referred to as chips) such as graphical processing unit chips (GPU). Because there is a tiny gap between the GPU and the cooler, air will enter, and it is difficult for the air to conduct heat, so it needs to be filled with the thermal conductive material (TCM) or thermal interface material (TIM), to conduct heat more effectively by form sealed structure without air. Typically, the TMC or TIM, as a grease, is smeared between the GPU and cooler and heat primarily conducts through the upper surface of the GPU and dissipated to the air by the cooler.

One drawback with such a cooling solution is that the surface area of the GPU contacting the cooler is limited. Another deficiency is that the rate of heat conduction through the TCM or TIM is limited. A third problem is that changing the shape of the cooler and/or a fan thereon provides limited improvements to cooling.

It would be advantageous to develop a cooling package that can improve upon one or more of these cooling limitations.

SUMMARY

One aspect provides a cooling package for an integrated circuit, embodiments of the cooling package including a package substrate of the integrated circuit, an enclosure and a thermal conductive material. The package substrate has a first package surface and the enclosure is mounted to the first package surface. The enclosure is sized to surround a circuit die locatable therein. A first die surface of the circuit die is coupled to the first package surface by a solder ball grid array such that a first gap is present between the first die surface of the circuit die and the first package surface. A second gap is present between interior sidewalls of the enclosure and sidewall surfaces of the circuit die. The thermal conductive material is located in the first gap and in the second gap such that the thermal conductive material contacts the first package surface of the package substrate, the inner sidewalls of the enclosure and the first die surface and the sidewall surfaces of the circuit die.

In any embodiments, the package substrate can be a printed circuit board and the circuit die can be a graphics processing unit integrated circuit die.

In some embodiments the thermal conductive material further contacts a second die surface of the circuit die, the second die surface being on an opposite side as the first die surface and in some such embodiments, a cooler is located on the thermal conductive material contacting the second die surface. Any such embodiments can further include a fan located on the cooler, the fan oriented to move air away from the cooler.

Some embodiments can further include a cooler located directly on a second die surface of the circuit die, the second die surface being on an opposite side as the first die surface.

Some embodiments can further include a cooler located on the first package surface and contacting one or more exterior sidewalls of the enclosure.

In any embodiments the enclosure can further includes an enclosure opening that align with an attachment opening in the first package surface and a pin located in the enclosure opening and in the attachment openings. In some such embodiments, the attachment opening is located in an electrical ground plate of the package substrate.

Any embodiments can include a second enclosure mounted to a second package surface of the package substrate, the second package surface on an opposite side as the first package surface, wherein the second enclosure is aligned with the enclosure, and a second thermal conductive material located in a third gap of the second enclosure and contacting the second package surface. Some such embodiments can further include a cooler that contacts the second thermal conductive material. For some such embodiments, the second enclosure mounted to the second package surface can further includes a second enclosure opening that aligns with a second attachment openings in the second package surface and a second pin can be located in the second enclosure opening and in the second attachment openings. For some such embodiments, the second attachment opening can be located in an electrical ground plate of the package substrate.

Another aspect is a method of assembling a cooling package for an integrated circuit. Embodiments of the method include providing a package substrate having a first package surface, and mounting an enclosure to the first package surface, the enclosure surrounding a location on the first package surface where a first die surface of a circuit die is couplable thereto by a solder ball grid array and the circuit die is locatable therein. A first gap is present between the first die surface of the circuit die and the first package surface of the package substrate, and a second gap is present between interior sidewalls of the enclosure and sidewall surfaces of the circuit die. The method includes filling the enclosure with a thermal conductive material such that the first gap and the second gap are filled with the thermal conductive material and the thermal conductive material contacts the first package surface, the inner sidewalls of the enclosure and the first die surface.

Any embodiments of the method can further include coupling the first die surface of the circuit die to the first package surface of the package substrate by the solder ball grid array.

For some such embodiments, the filling includes covering the circuit die such that the thermal conductive material contacts a second die surface of the circuit die, the second die surface being on an opposite side as the first die surface. For some such embodiments, the mounting of the enclosure includes inserting pins into openings in the enclosure and further inserting the pins into attachment openings in the first package surface.

Any embodiments of the method can further include mounting a cooler to the enclosure such that the thermal conductive material contacts the second die surface and contacts the cooler. Any embodiments of the method can further include mounting a second enclosure to a second package surface of the package substrate, the second package surface on an opposite side as the first package surface, wherein the second enclosure is aligned with the enclosure, filling the second enclosure with a second thermal conductive material, the second thermal conductive material located in a third gap of the second enclosure and contacting the second package surface and mounting a second cooler to the second enclosure such that the second thermal conductive material contacts the second die surface and the cooler.

Another aspect is an integrated circuit cooling package embodiment that includes a package substrate having a first package surface and a second package surface on an opposite side as the first package surface with first and second enclosures thereon. A first enclosure is mounted to the first package surface, the enclosure sized to surround a circuit die therein. A first die surface of the circuit die is coupled to the first package surface by a solder ball grid array such that a first gap is present between the first die surface of the circuit die and the first package surface, and a second gap is present between interior sidewalls of the enclosure and sidewall surfaces of the circuit die. A first thermal conductive material is located in the first gap and in the second gap such that the thermal conductive material contacts the first package surface of the package substrate, the inner sidewalls of the enclosure and the first die surface and the sidewall surfaces of the circuit die. A second enclosure is mounted to the second package surface, wherein the second enclosure is aligned with the first enclosure. A second thermal conductive material is located in a third gap of the second enclosure and contacting the second package surface.

Some such embodiments can include a first cooler located on the thermal conductive material contacting the second die surface and optionally a fan located on the first cooler, the fan oriented to move air away from the first cooler. Some such embodiments can include a second cooler located on the first package surface and contacting one or more exterior sidewalls of the enclosure. Some such embodiments, can include a third cooler that contacts the second thermal conductive material and optionally a second fan located on the third cooler, the second fan oriented to move air away from the third cooler.

Another aspect is a computer having one or more circuits that include any embodiments of the integrated circuit cooling package disclosed herein.

BRIEF DESCRIPTION

Figure 2:
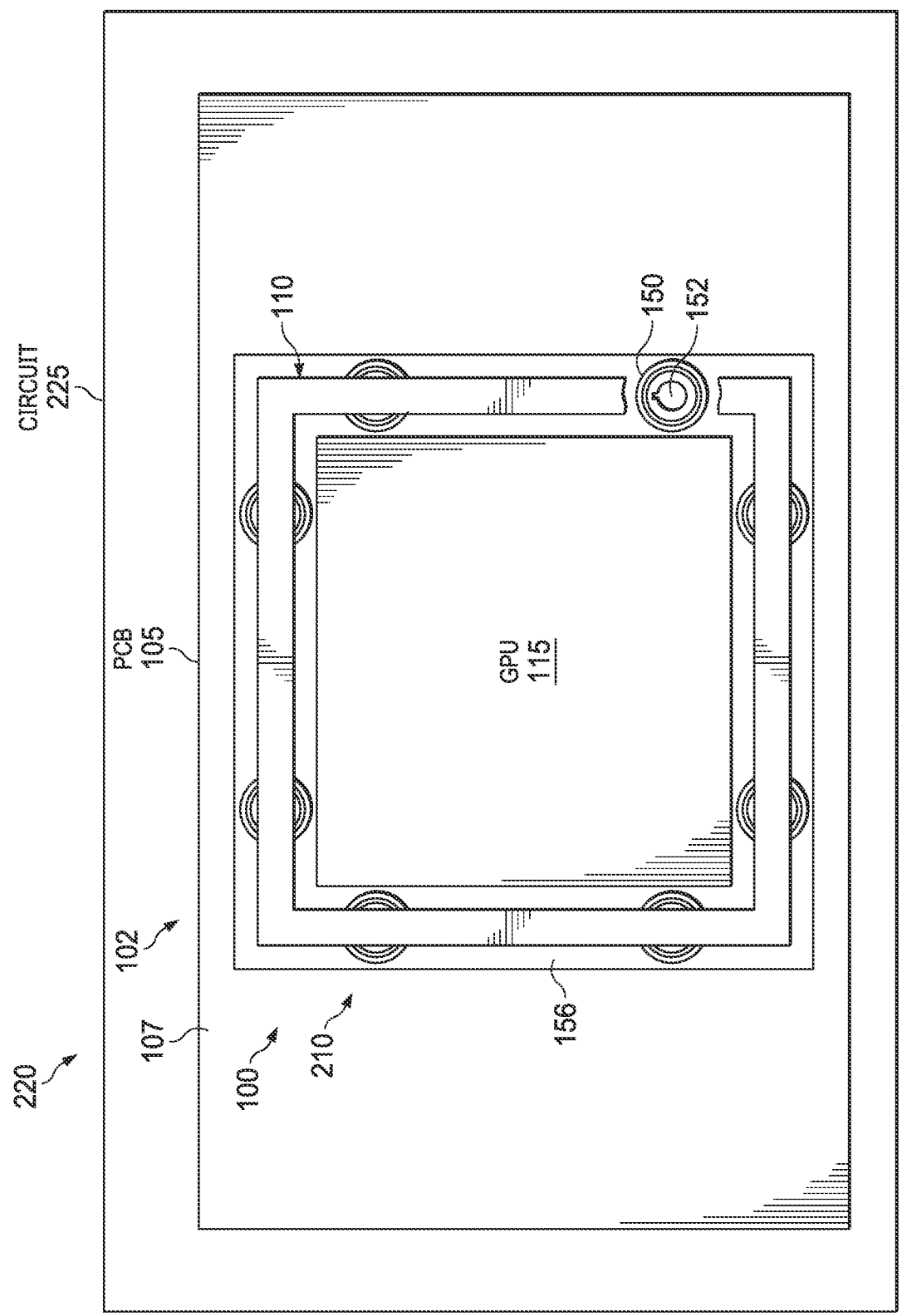
Figure 3:
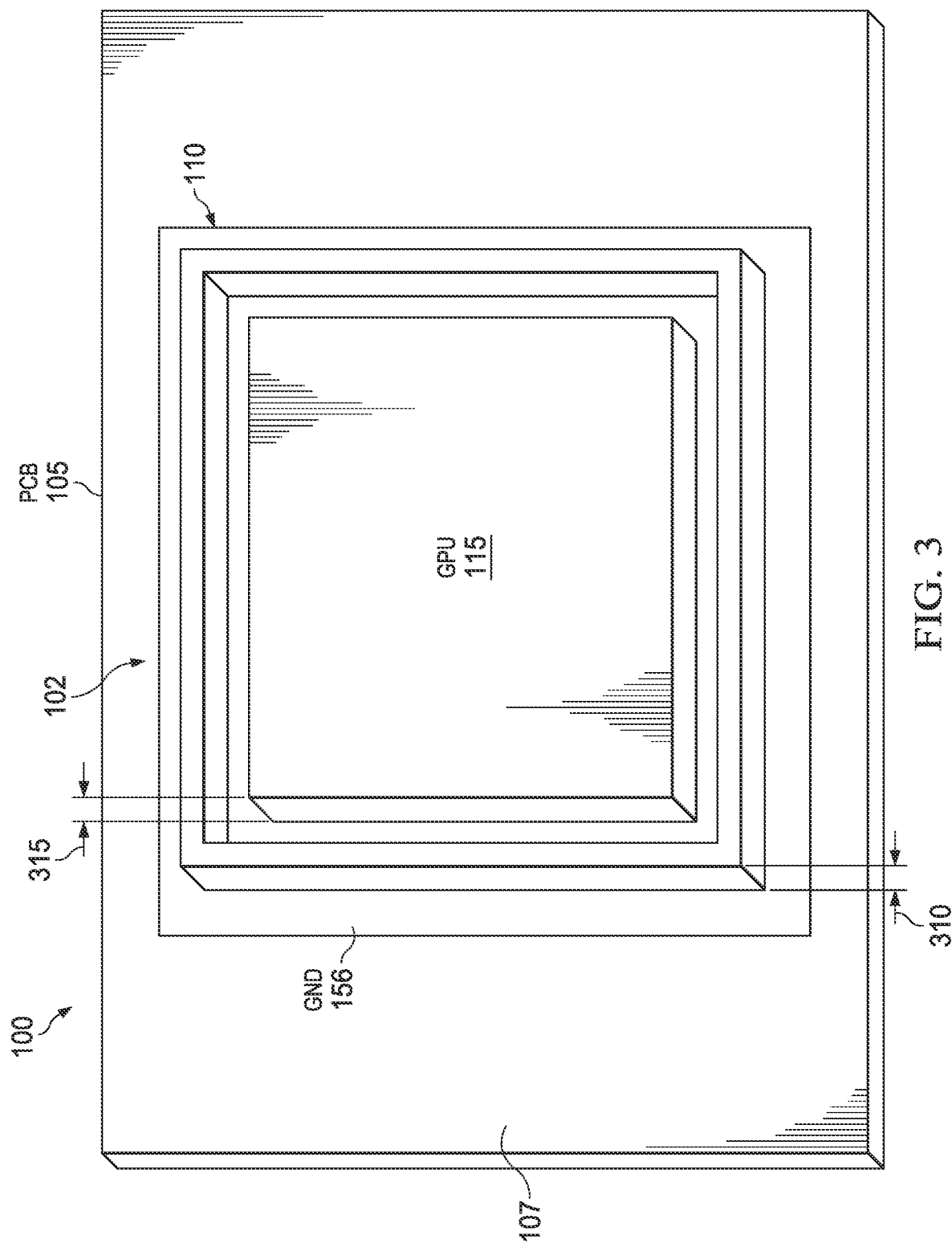
Figure 4:
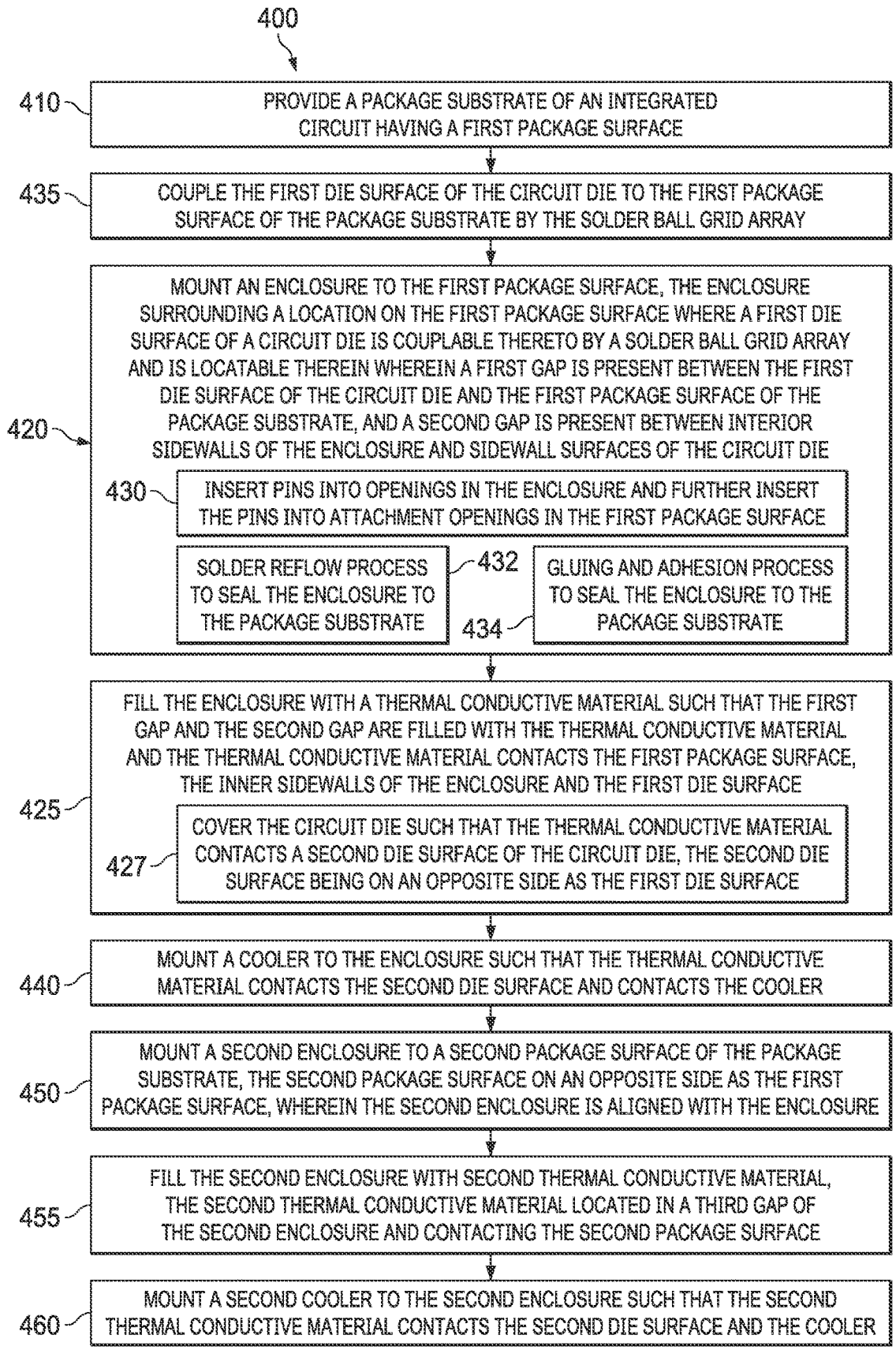

Reference is now made to the following descriptions taken in conjunction with the accompanying drawings, in which:

FIG. 1 presents a cross-sectional view of an example embodiment of the cooling package of the disclosure including a top and bottom side enclosure;

FIG. 2 presents a top down view of an example cooling package of the disclosure similar to the cooling package depicted in FIG. 1;

FIG. 3 presents a perspective view of an example cooling package of the disclosure similar to the cooling packages depicted in FIGS. 1 and 2; and FIG. 4 presents a flow diagram of example embodiments of a method of manufacturing a cooling package according to the principles of the disclosure, including any of the packages such as disclosed in the context of FIGS. 1-3.

DETAILED DESCRIPTION

Embodiments of the disclosure follow from our recognition of the drawbacks of existing cooling solutions for integrated circuits. In particular because the existing solutions leave the circuit die as an open structure with only one (e.g., upper) surface of the die covered with the TCM or TIM with heat sink structures thereon, the other surfaces of the dies (e.g., the bottom and side surfaces) of the die are unable to dissipate the heat as effectively.

To help mitigate these drawbacks, our cooling solution provides a new cooling package mechanical structure where multiple, and in some embodiments, all, surfaces of the circuit die are contacted to a TCM that has a combination of both high thermal conductivity and high electrical resistance conductivity, to thereby provide more effective heat dissipation as compared with the prior cooling solutions. By contacting multiple surfaces of the circuit die with such a TCM, and a surrounding cooling enclosure, heat generated by the circuit die can be dissipated from the upper, bottom and/or side surfaces of the die more efficiently than previously possible for existing cooling solutions.

It would not have been obvious to provide such a cooling package as disclosed herein, at least because this would detract from the much simpler traditional cooling solutions used with integrated circuit (IC) package manufacturing. As further disclosed herein, a seamless and sealed enclosure structure had to be designed to be mounted onto a package substrate so that a liquid or gel state of the TMC could be poured into the enclosure so as fill gaps between the die and the package substrate and the enclosure walls, and held in the enclosure until the TCM solidified to provide a solid TCM contacting multiple surfaces of the die.

This is in contrast to traditional thinking of the solutions to improve the heat conducting from a die, such as increasing the surface area of die or using more powerful cooling fans, and/or applying TIM materials with increased heat conductivity to the upper die surface. These traditional solutions ignored improving heat dissipation from the other dies surfaces because they were thought to be too hard to implement. However, with the ever-increasing die power consumption, the limitations of such traditional heat dissipation solutions will result in a bottleneck in die performance. The cooling package structures and method of manufacturing, as disclosed herein, helps to mitigate or delays the occurrence of such a bottleneck.

Because of the improvement in heat conduction and dissipation efficiency greatly, we expect that circuit die with higher performance and power consumption can be implemented and/or lower fan speeds can be used for existing circuit die performance levels and power consumption, with a desirable reduction in fan noise, provide a new package substrate design for industry adoption.

One aspect of the disclosure is a cooling package. FIGS. 1-3 illustrate cross-sectional, plan views and perspective view of various embodiments of the cooling package 100 for an integrated circuit 102, in accordance with the invention. With continuing reference to FIGS. 1-3, any of the package 100 embodiments can include a package substrate 105 of the integrated circuit 102 having a first package surface 107 (e.g., in some embodiments, an upper die mounting surface of a printed circuit board, PCB, substrate). Embodiments of the package can include an enclosure 110 mounted to the first package surface 107. The enclosure 110 is sized to surround a circuit die 115 locatable therein. A first die surface 117 (e.g., a bottom surface) of the circuit die 115 is couplable to the first package surface 107 by a solder ball grid array 119 such that a first gap 120 is present between the first die surface 117 of the circuit die 115 and the first package surface 107. A second gap 122 is present between interior sidewalls 125 of the enclosure 110 and sidewall surfaces 127 of the circuit die. The package 100 includes a thermal conductive material (TCM) 130 located in the first gap 120 and in the second gap 122 such that the TCM 130 contacts the first package surface 107 of the package substrate 105, the inner sidewalls 125 of the enclosure 110 and the first die surface 117 and the sidewall surfaces 127 of the circuit die 115.

The term circuit die (die 115), as used herein, refers to any of a central processing unit (CPU), a graphics processing unit (GPU), a memory chip, or other integrated circuit dies or chips that generate heat during their operation, as familiar to those skilled in the pertinent arts, or, combinations thereof.

Some embodiments of the package 100 can further include any such circuit dies located in the enclosure where the first die surface 117 of the circuit die 115 is coupled to the first package surface 107 by the solder ball grid array 119 and thereby provide the first and second gaps 120, 122.

The term thermal conductive material as used herein, refers to a material having a high electrical resistance so as to not electrically interfere with the circuit die's operation (e.g., by electrically shorting out the solder balls of the array 119) and a high thermal conductivity so as to provide high heat dissipation from the die during its operation. The term high electrical resistance as used herein refers to a material having an electrical resistivity of greater than or equal to about $1 \times 10^8$ Ohm meter ($\Omega \cdot m$). The term high thermal conductivity as used herein refers to the material having a thermal conductivity of equal to or greater than about 1 Watts per meter Kevin (W/mK).

In some embodiments, the use of a fluid TCM facilitates filling the gaps (e.g., gaps 120, 122) with the TCM such that there is no air in the gaps. In some such embodiments, the TCM can solidify to facilitate retaining the TCM in the gaps. In some such embodiments, the TCM 130 can be a liquid or gel that can cure to a solid material. For instance, such embodiments of the TCM 130, as a liquid or gel, can be poured or injected into the enclosure 110 to wrap around and surround the circuit die 115 such that the first and second gaps 120, 122 are filled with the TCM 130 and the TCM contacts the first package surface 107, the enclosure inner sidewalls 125 and the first die surface 117 and the sidewall surfaces 127 of the circuit die 115. The liquid or gel TCM is then held in the enclosure 110 until it cures to a solid TCM.

Non-limiting example embodiments of the TCM 130 include a base material such as silicon, alkyl oil or rubber with added filler materials such as metal or ceramic particles with varying size distributions and/or shapes. Providing the TDM 130 in liquid or gel form facilitates rapid and precise filling of the enclosure 110 to form the TDM 130 as an effective conductive layer.

One skilled in the pertinent art would understand that silicon, alkyl oil or rubber used as the base material for the TCM can include elastomeric resins such as silicone resin (e.g., polysiloxanes) and further include additive heat conductive filler materials such as metal oxides, hydroxides, or nitrides (e.g., magnesium, aluminum, boron, cerium oxide, aluminum oxides, hydroxides, or nitrides or combinations thereof) which can be introduced into the enclosure 110 as a liquid or gel and then cured or vulcanized to form a solid elastomeric polymer such as silicone elastic rubber.

As further illustrated in FIG. 1, in some embodiments of the cooling package 100, the TCM 130 further contacts a second die surface 132 (e.g., upper surface) of the circuit die 115, the second die surface 132 being on an opposite side as the first die surface 117. E.g., in some such embodiments, the enclosure 110 can be sized such that the TCM 130 contacts the first die surface 117, the sidewall surfaces 127 and the second die surface 132 of the circuit die 115 in the enclosure 110. E.g., the height of the enclosure's walls (e.g., FIG. 3, enclosure height 310) is designed such greater than the die's 115 (e.g., FIG. 3, die height 315). E.g., when the TCM 130 is introduced (e.g., liquid TCM poured or injected) into the enclosure 110 the enclosure's 110 size is such that the TCM 130 can cover the circuit die 115 located within the enclosure 110 with the TCM staying within the enclosure.

As further illustrated in FIG. 1, embodiments of the cooling package 100 can further include a cooler 135 located on the TCM 130 that contacts the second die surface 132. Non-limiting example cooler examples include aluminum or copper structures. While aluminum is cheaper and lighter, it has a lower thermal conductivity than copper. Copper as a higher thermal conductivity than aluminum but more expensive and heavier In some such embodiments, the package 100 can further include a fan 137, the fan 137 oriented to move air away from the cooler 135 and thereby away from the circuit die 115. Non-limiting example fan embodiments include axial fans to move air in and out in a same direction, and, blower fans to mover air in and out at right angles with respect to each other.

In other embodiments, the cooler 135 can be located directly on the second die surface 132, e.g., with no intervening TCM 130 in-between the cooler 135 and the second die surface 132. In such embodiments the TCM 130 may thus only contact the first die surface 117 and the sidewall surfaces 127.

As further illustrated in FIG. 1, some embodiments of the cooling package 100 can include a cooler 140 (e.g., a second cooler, in some embodiments) located on the first package surface 107 and contacting one or more exterior sidewalls 142 of the enclosure 110, e.g., to facilitate heat dissipation from the circuit die 115 sidewall surfaces 127.

As further illustrated in FIG. 1, for some embodiments of the cooling package 100, to facilitate mounting the enclosure 110 to the package substrate 105, the enclosure 110 can include one or more enclosure opening 150 that align with one or more attachment opening 152 in the first package surface 107 and include a pin 154 located in the enclosure opening 150 and in the attachment openings 152. In some such embodiments to facilitate electrical grounding of the enclosure 110, the attachment opening 152 can located in an electrical ground plate 156 of the package substrate 105.

As further illustrated in FIG. 1, some embodiments of the cooling package 100 can further include a second enclosure 160 mounted to a second package surface 162 of the package substrate 105, the second package surface 162 on an opposite side as the first package surface 107. The second enclosure 160 is aligned with the enclosure 110, e.g., such that the enclosure is centered below the circuit die 115. A second TCM 164 is located in a third gap 166 of the second enclosure 160 and contacting the second package surface 162. Some such embodiments can further include including a cooler 168 (e.g., a third cooler, in some embodiments) that contacts the second TCM 164, e.g., to facilitate heat dissipation from the first die surface 117. Some such embodiments can further include wherein the second enclosure 160 mounted to the second package surface 162 further includes one or more second enclosure openings 170 that align with a second attachment openings 172 in the second package surface 162 and a second pin 174 is located in the second enclosure opening 170 and in the second attachment openings 172. In some such embodiments, the second attachment opening 172 is located in an electrical ground plate 156 of the package substrate 105, e.g., to facilitate electrical grounding of the second enclosure 160. In some embodiments, the enclosure opening 150 and the second enclosure opening 170 can be aligned with each other to provide a single continuous through-hole opening (e.g., openings 150, 170 are a same continuous single opening) of the package substrate 105, and, in such embodiments, the pins 154 and second pin 174 can be a same single pin (e.g., pins 154, 174 are a same continuous single pin) which traverses the ground plate 154 and enters into the enclosure opening 150 and into one of the second enclosure openings 170.

In some embodiments, the pins 154, 174 can be threaded to facilitate attachment to the openings 150, 170, respectively. E.g., the pins 154, 174 can be shapes as aluminum screws to increase heat conduction and dissipation efficiency.

In some embodiments, the electrical ground plate 156 can be a perimeter trace (e.g., FIG. 2, trace 210) for mounting the enclosure 110 and second enclosure 160 thereto. In some embodiments the electrical ground plate 156 can include solder to facilitate solder mounting one or both of the enclosures 110, 160 (e.g., composed of a metal such as aluminum or copper) to the ground plate 154. In other embodiments, the enclosures 110, 160 can be mounted to the package substrate 105 via glue or other adhesives familiar to those skilled in the art.

As illustrated in FIG. 1, some embodiments of the package 100 can include a package substrate 105, a first enclosure 110 mounted to the first package surface 107 and surrounding the circuit die 115, a first TCM 130 located in gaps 120, 122 between circuit die 115 and the first enclosure 11 and the first package surface 107, a second enclosure 160 mounted to the second package surface 162 and aligned with the first enclosure 110, and, a second TCM 164 located in a third gap 166 of the second enclosure 160 and contacting the second package surface 162.

Some such embodiments can further include a first cooler 135 located on the TCM 130 contacting the second die surface 132 and a fan 137 located on the first cooler 135, the fan 137 oriented to move air away from the first cooler 135, a second cooler 140 located on the first package surface 107 and contacting one or more exterior sidewalls 142 of the enclosure 110, and a third cooler 168 that contacts the second TCM 164 and a second fan 180 located on the third cooler 168, the second fan 180 oriented to move air away from the third cooler 168.

For such embodiments, the heat on the surface 132 of the die 115 can be conducted by the upper-located TCM 130 and dissipated by the upper first cooler 135 and the heat on four sidewall surfaces 127 of the die 115 dissipated by a surrounding TCM 130 and second cooler 140, and the heat of the dies' bottom side surface 117 can be conducted by the bottom ground plate 156 of the package substrate 105 to the bottom third cooler 168 on the opposite side surfaces 107, 162 of the substrate 105. Further, the upper cooler 135 and the bottom cooler 168 can be secured to either side surfaces 107, 163 of the substrate 105 with pins 174 (e.g., aluminum screws 174) to raise the overall heat dissipation efficiency.

The heat conduction and dissipation efficiency gained from using the disclosed package 100 are expected to be improved in proportion to increasing the heat dissipation area of die 115 contacting the TCM 130, e.g., by at least 30, 50%, 70% and up to 90% in various package embodiments, as compared the traditional solution where only the upper surface 132 contacted by a TCM or TIN and heat sink thereon.

Another aspect is a computer having one or more circuits (e.g., FIG. 2, computer 220, circuit board 225) that include the integrated circuit cooling package 100. E.g., any embodiments of the integrated circuit cooling package 100 disclosed herein can be part of a computer having one or more circuits that include the cooling package 100 thereon.

Another aspect of the disclosure is a method of assembling an integrated circuit cooling package. FIG. 4 illustrates by flow diagram selected steps in a method 400 of manufacturing the integrated circuit cooling package 100 of the disclose including the assembly of any of the embodiments of the package 100 discussed in the context of FIGS. 1-3.

With continuing reference to FIGS. 1-4 throughout, as illustrated in FIG. 4, embodiments of the method 400 can include providing (step 410) a package substrate 105 of an integrated circuit 102 having a first package surface 107 and. The method 400 can further include mounting (step 420) an enclosure 110 to the first package surface 107, the enclosure 110 surrounding a location on the first package surface where a first die surface 117 of a circuit die 115 is couplable thereto by a solder ball grid array 119 and the circuit die is locatable in the enclosure 110, where a first gap 120 is present between the first die surface 117 of the circuit die 115 and the first package surface 107 of the package substrate 105, and a second gap 122 is present between interior sidewalls 125 of the enclosure 110 and sidewall surfaces 127 of the circuit die. The method can further include filling (step 425) the enclosure 110 with a TCM 130 such that the first gap 120 and the second gap 122 are filled with the TCM 130 and the TCM 130 contacts the first package surface 107, the inner sidewalls 125 of the enclosure 110 and the first die surface 117.

In some embodiments, the filling (step 425) includes covering (step 427) the circuit die 115 such that the TCM 130 contacts a second die surface 132 of the circuit die 115, the second die surface 132 being on an opposite side as the first die surface 117. E.g., once the enclosure 110 is mounted and sealed to the package substrate 105 a liquid TCM 130 can be poured into the sealed enclosure so as to wrap around the whole circuit die not only on the upper surface 132 but all four side surfaces 127 and the bottom surface 117 of the circuit die 115.

In some embodiments, the mounting of the enclosure (step 420) includes inserting pins (step 430) into openings 150 in the enclosure and further inserting the pins into attachment openings 152 in the first package surface 107.

Any embodiments of mounting the enclosures 110, 160 (steps 420 or 450) to the package substrate 105 can include a reflow soldering process (e.g., step 432) or a gluing and adhesion process (e.g., step 434), or both, to seal the enclosure to the substrate, as familiar to those skilled in the art.

Some embodiments of the method 400 further include coupling (step 435) the first die surface 117 of the circuit die 115 to the first package surface 107 of the package substrate by the solder ball grid array 119. In some such embodiments, the first die surface of the circuit die can be coupled to the first package surface of the package substrate in accordance with step 435 before mounting the enclosure 110 in accordance with step 420, while in other such embodiments, the enclosure 110 can be mounted (step 420) and then the first die surface of the circuit die can be coupled (step 435).

Some embodiments of the method 400 can further include mounting (step 440) a cooler 135 to the enclosure 110 such that the TCM 130 contacts the second die surface 132 and contacts the cooler 135.

Any embodiment of the method 400 can also include mounting (step 450) a second enclosure 160 to a second package surface 162 of the package substrate 105, the second package surface 162 on an opposite side as the first package surface 107, wherein the second enclosure 160 is aligned with the enclosure 110, filling (step 455) the second enclosure 160 with second TCM 164, the second TCM 164 located in a third gap 166 of the second enclosure 160 and contacting the second package surface 162 and mounting (step 460) a second cooler 168 to the second enclosure 160 such that the second TCM 164 contacts the second die surface 132 and the cooler 135. In some embodiments the TCM (e.g., TCM 130 or TCM 164) after contacting air for a period of time (e.g., 10, 60, or 600 minutes), can change to solid, e.g., via curing.

In this condition, the heat on the surface of the chip can be conducted by the upper thermal conductive material (e.g., TCM 130) and dissipated by the upper cooler, the heat on four sides of the chip by the surrounding thermal conductive material and cooler, and the heat of the chip's bottom is conducted by the bottom ground of PCB to the below cooler on the opposite side of PCB. In some embodiments, we connect the upper cooler and the bottom cooler on both sides of PCB can be connected with aluminum screws to raise the whole cooler dissipation efficiency and improve the heat conduction efficiency.

Those skilled in the art to which this application relates will appreciate that other and further additions, deletions, substitutions and modifications may be made to the described embodiments.

What is claimed is:

1. A cooling package for an integrated circuit, the cooling package comprising:
   a package substrate of the integrated circuit having a first package surface;
   an enclosure mounted to the first package surface, the enclosure sized to surround a circuit die locatable therein, wherein,
      the enclosure further includes an enclosure opening that align with an attachment opening in the first package surface and a pin located in the enclosure opening and in the attachment openings;
   a first die surface of the circuit die couplable to the first package surface by a solder ball grid array such that a first gap is present between the first die surface of the circuit die and the first package surface, and
   a second gap is present between interior sidewalls of the enclosure and sidewall surfaces of the circuit die; and
   a thermal conductive material located in the first gap and in the second gap such that the thermal conductive material contacts the first package surface of the package substrate, the inner sidewalls of the enclosure and the first die surface and the sidewall surfaces of the circuit die.

2. The package of claim 1, wherein the package substrate is a printed circuit board and the circuit die is a graphics processing unit integrated circuit die.

3. The cooling package of claim 1, wherein the thermal conductive material further contacts a second die surface of the circuit die, the second die surface being on an opposite side as the first die surface.

4. The cooling package of claim 3, further including a cooler located on the thermal conductive material contacting the second die surface.

5. The cooling package of claim 4, further including a fan located on the cooler, the fan oriented to move air away from the cooler.

6. The cooling package of claim 1, further including a cooler located directly on a second die surface of the circuit die, the second die surface being on an opposite side as the first die surface.

7. The cooling package of claim 1, further including a cooler located on the first package surface and contacting one or more exterior sidewalls of the enclosure.

8. The cooling package of claim 1, wherein the attachment opening is located in an electrical ground plate of the package substrate.

9. The cooling package of claim 1, further including:
   a second enclosure mounted to a second package surface of the package substrate, the second package surface on an opposite side as the first package surface, wherein the second enclosure is aligned with the enclosure; and
   a second thermal conductive material located in a third gap of the second enclosure and contacting the second package surface.

10. The cooling package of claim 9, further including a cooler that contacts the second thermal conductive material.

11. The cooling package of claim 9, wherein the second enclosure mounted to the second package surface further includes a second enclosure opening that aligns with a second attachment openings in the second package surface and a second pin is located in the second enclosure opening and in the second attachment openings.

12. The cooling package of claim 11, wherein the second attachment opening is located in an electrical ground plate of the package substrate.

13. An integrated circuit cooling package, comprising:
   a package substrate having a first package surface and a second package surface on an opposite side as the first package surface;
   a first enclosure mounted to the first package surface, the first enclosure sized to surround a circuit die therein, wherein, a first die surface of the circuit die is coupled to the first package surface by a solder ball grid array such that a first gap is present between the first die surface of the circuit die and the first package surface, and a second gap is present between interior sidewalls of the first enclosure and sidewall surfaces of the circuit die;
   a first thermal conductive material located in the first gap and in the second gap such that the thermal conductive material contacts the first package surface of the package substrate, the inner sidewalls of the first enclosure and the first die surface and the sidewall surfaces of the circuit die;
   a second enclosure mounted to the second package surface, wherein the second enclosure is aligned with the first enclosure; and
   a second thermal conductive material located in a third gap of the second enclosure and contacting the second package surface.

14. The package of claim 13, further including:
   a first cooler located on the thermal conductive material contacting a second die surface of the circuit die and a fan located on the first cooler, the fan oriented to move air away from the first cooler;
a second cooler located on the first package surface and contacting one or more exterior sidewalls of the enclosure; and
a third cooler that contacts the second thermal conductive material and a second fan located on the third cooler, the second fan oriented to move air away from the third cooler.

15. A computer having one or more circuits that include the integrated circuit cooling package of claim 13.

* * * * *